(12) United States Patent
Gong et al.

(10) Patent No.: US 11,688,799 B2
(45) Date of Patent: Jun. 27, 2023

(54) IGBT DEVICE

(71) Applicant: SUZHOU ORIENTAL SEMICONDUCTOR CO., LTD., Jiangsu (CN)

(72) Inventors: Yi Gong, Jiangsu (CN); Wei Liu, Jiangsu (CN); Lei Liu, Jiangsu (CN); Zhendong Mao, Jiangsu (CN); Xin Wang, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 17/425,883

(22) PCT Filed: Dec. 6, 2019

(86) PCT No.: PCT/CN2019/123760
§ 371 (c)(1),
(2) Date: Jul. 26, 2021

(87) PCT Pub. No.: WO2021/103114
PCT Pub. Date: Jun. 3, 2021

(65) Prior Publication Data
US 2022/0285534 A1 Sep. 8, 2022

(30) Foreign Application Priority Data

Nov. 29, 2019 (CN) .......................... 201911204531.1

(51) Int. Cl.
*H01L 29/739* (2006.01)
(52) U.S. Cl.
CPC .................................. *H01L 29/7395* (2013.01)
(58) Field of Classification Search
CPC .......... H01L 29/66333; H01L 29/6634; H01L 29/66348; H01L 29/7395; H01L 29/7396
See application file for complete search history.

(56) References Cited

U.S. PATENT DOCUMENTS

2016/0172453 A1 6/2016 Hirabayashi et al.

FOREIGN PATENT DOCUMENTS

| CN | 104576646 A | * 4/2015 |
| CN | 106847891 | 6/2017 |

(Continued)

OTHER PUBLICATIONS

First Office Action dated Oct. 21, 2021 from People's Republic of China (Year: 2021).*

(Continued)

*Primary Examiner* — Robert G Bachner
*Assistant Examiner* — Molly K Reida
(74) *Attorney, Agent, or Firm* — Michael Best & Friedrich LLP

(57) ABSTRACT

Provided is an IGBT device. The IGBT device includes an MOSFET cell array, where each MOSFET cell includes a p-type body region located at the top of an n-type drift region, an n-type emitter region located in the p-type body region, and a gate dielectric layer, a gate electrode and an n-type floating gate which are located above the p-type body region. The gate electrode is located above the gate dielectric layer, the n-type floating gate is located above the gate dielectric layer, and the gate electrode acts on the n-type floating gate through capacitive coupling. The n-type floating gate of at least one MOSFET cell is isolated from the p-type body region through the gate dielectric layer, and the n-type floating gate of at least one MOSFET cell contacts the p-type body region through an opening in the gate dielectric layer to form a p-n junction diode.

6 Claims, 1 Drawing Sheet

(56) References Cited

FOREIGN PATENT DOCUMENTS

| | | |
|---|---|---|
| CN | 109755303 | 5/2019 |
| JP | 2014049552 | 3/2014 |

OTHER PUBLICATIONS

PCT/CN2019/123760 International Search Report and Written Opinion dated Aug. 26, 2020.

* cited by examiner

IGBT DEVICE

CROSS-REFERENCE TO RELATED APPLICATIONS

This is a National Stage Application, filed under 35 U.S.C. 371, of International Patent Application No. PCT/CN2019/123760, filed on Dec. 6, 2019, which claims priority to Chinese Patent Application No. 201911204531.1 filed on Nov. 29, 2019, the disclosures of both of which are incorporated herein by reference in their entireties.

TECHNICAL FIELD

The present application belongs to the technical field of insulated gate bipolar transistor (IGBT) devices and, for example, to an IGBT device with an adjustable reverse recovery speed.

BACKGROUND

An insulated gate bipolar transistor (IGBT) device is a device composed of a metal-oxide-semiconductor (MOS) transistor and a bipolar transistor, and an input of the IGBT device is the MOS transistor and an output of the IGBT device is a PNP transistor. The turn-on and turn-off of the IGBT device in the related art are controlled by a gate-emitter voltage. When the gate-emitter voltage is greater than a threshold voltage Vth of the MOS transistor, a current channel is formed inside the MOS transistor and a base current is supplied to the bipolar transistor so that the IGBT device is turned on. When the gate-emitter voltage is less than the threshold voltage Vth of the MOS transistor, the current channel inside the MOS transistor will be turned off and the base current of the bipolar transistor will be turned off so that the IGBT device is turned off. If the IGBT device in the related art is turned off, when a collector-emitter voltage is less than 0 V, a body diode parasitic in the IGBT device is in a positive bias state, and a reverse current flows from an emitter to a collector through the body diode. In this case, the current in the body diode injects minority carriers, and reverse recovery of these minority carriers is carried out when the IGBT device is turned on again, causing a relatively large reverse recovery current and long reverse recovery time.

SUMMARY

The present application provides an IGBT device with an adjustable reverse recovery speed, to solve the issue of long reverse recovery time caused by the minority carriers injection of an IGBT device in the related art.

An IGBT device is provided in an embodiment of the present disclosure and includes an n-type collector region, a p-type collector region, an n-type drift region located above the n-type collector region and the p-type collector region, and an metal-oxide-semiconductor field effect transistor (MOSFET) cell array composed of multiple MOSFET cells.

Each of the multiple MOSFET cells includes a p-type body region located at the top of the n-type drift region, an n-type emitter region located in the p-type body region, and a gate structure located above the p-type body region, where the gate structure includes a gate dielectric layer, a gate electrode and an n-type floating gate, the gate electrode and the n-type floating gate are located above the gate dielectric layer, the gate electrode is located on a side close to the n-type emitter region, the n-type floating gate is located on a side close to the n-type drift region, and the gate electrode acts on the n-type floating gate through capacitive coupling.

In the MOSFET cell array, the n-type floating gate of at least one MOSFET cell is isolated from the p-type body region through the gate dielectric layer, and the n-type floating gate of at least one MOSFET cell contacts the p-type body region through an opening to form a p-n junction diode, where the opening is located in the gate dielectric layer below the n-type floating gate.

In an embodiment, the IGBT device of the present application further includes an n-type field cut-off region located above the n-type collector region and the p-type collector region, where the n-type field cut-off region is located below the n-type drift region.

In an embodiment, in the IGBT device of the present application, the gate electrode extends above the n-type floating gate.

In an embodiment, in the IGBT device of the present application, the gate electrode extends above the n-type floating gate and covers a sidewall of the n-type floating gate close to the n-type drift region.

In an embodiment, in the IGBT device of the present application, the opening is located below the n-type floating gate and on a side close to the n-type drift region.

In an embodiment, in the IGBT device of the present application, a gate electrode of at least one MOSFET cell is electrically connected to the n-type emitter region.

According to the IGBT device provided by the embodiment of the present disclosure, the reverse recovery speed of the IGBT device can be conveniently and accurately adjusted by controlling the number of MOSFET cells formed with p-n junction diodes, so that the IGBT device has wider application. Meanwhile, when the number of MOSFET cells formed with the p-n junction diodes is adjusted, it is only necessary to modify one mask for forming the opening in the gate dielectric layer, which can effectively control the manufacturing cost of the IGBT device.

BRIEF DESCRIPTION OF DRAWINGS

Drawings used in the embodiments are briefly described below.

DETAILED DESCRIPTION

Figure 1:
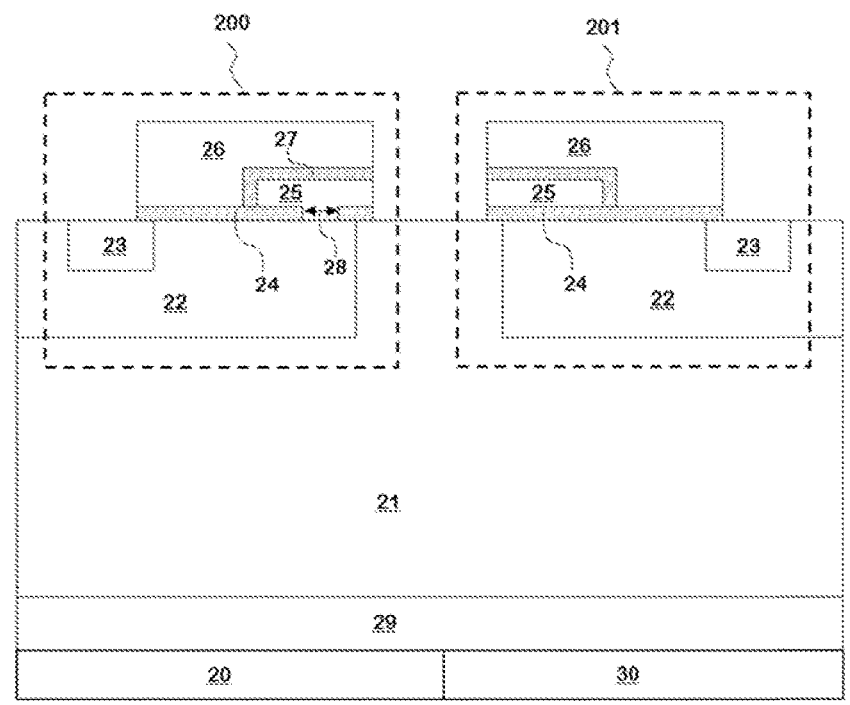
FIG. 1 is a sectional view of an IGBT device according to a first embodiment of the present application.

The scheme of the present application is described hereinafter through specific implementations in conjunction with the drawings in the embodiments of the present disclosure. Meanwhile, in the schematic diagrams illustrated in the drawings of the specification, the sizes of layers and the sizes of regions described in the present application are enlarged, and the sizes illustrated in the drawings do not represent the actual sizes. The embodiments described in the specification are not intended to limit the regions shown in the drawings to specific shapes, but include obtained shapes, for example, deviations due to manufacturing.

FIG. 1 is a sectional view of an IGBT device according to a first embodiment of the present application. As shown in FIG. 1, an IGBT device provided by an embodiment of the present disclosure includes an n-type collector region 20, a p-type collector region 30, an n-type field cut-off region 29 located above the n-type collector region 20 and the p-type collector region 30, an n-type drift region 21 located above the n-type field cut-off region 29, and an MOSFET cell array composed of multiple MOSFET cells. Two MOSFET cells (MOSFET cell 200 and MOSFET cell 201) are exemplarily shown in FIG. 1.

The MOSFET cell of the embodiment of the present disclosure includes a p-type body region 22 located at the top of the n-type drift region 21, an n-type emitter region 23 located in the p-type body region 22, and a gate structure located above the p-type body region 22. The gate structure includes a gate dielectric layer 24, an n-type floating gate 25 and a gate electrode 26. The gate electrode 26 is located above the gate dielectric layer 24 and located on a side close to the n-type emitter region 23, and extends toward a side of the n-type drift region 21 to be located above the n-type floating gate 25. The n-type floating gate 25 is located above the gate dielectric layer 24 and located on a side close to the n-type drift region 21. The gate electrode 26 and the n-type floating gate 25 are isolated by an insulating dielectric layer 27, and the gate electrode 26 acts on the n-type floating gate 25 through capacitive coupling. The insulating dielectric layer 27 is generally silicon dioxide.

In the MOSFET cell array of the embodiment of the present disclosure, the n-type floating gate 25 of at least one MOSFET cell (such as the MOSFET cell 201 shown in FIG. 1) is isolated from the p-type body region 22 through the gate dielectric layer 24, and the n-type floating gate 25 of at least one MOSFET cell (such as the MOSFET cell 200 shown in FIG. 1) contacts the p-type body region 22 through an opening 28 in the gate dielectric layer 24 located below the n-type floating gate 25 to form a p-n junction diode.

Figure 2:
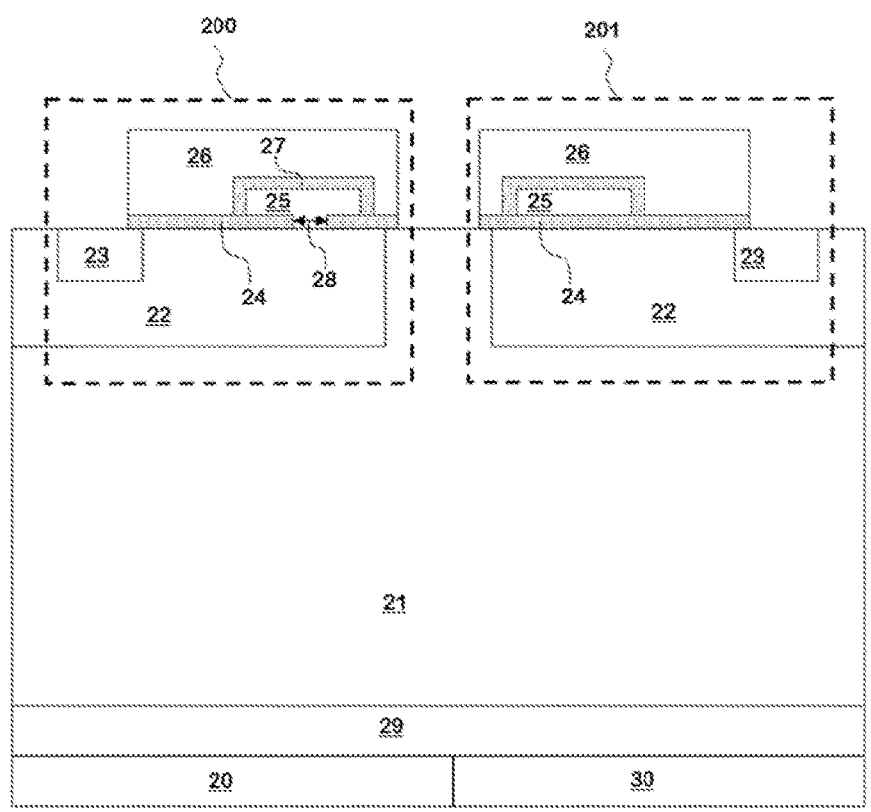
FIG. 2 is a sectional view of an IGBT device according to a second embodiment of the present application.

The gate electrode 26 of the MOSFET cell in the embodiment of the present disclosure may be located on only the side close to the n-type emitter region 23, i.e., in a lateral direction, the gate electrode 26 and the n-type floating gate 25 are disposed left and right, or the gate electrode 26 may be located on the side close to the n-type emitter region 23 and extend toward a side of the n-type drift region 21 to be located above the n-type floating gate 25 (as shown in FIG. 2). The gate electrode 26 extends above the n-type floating gate 25, which can increase an area of the n-type floating gate 25 covered by the gate electrode 26 and increase the capacitive coupling rate of the gate electrode 26 to the n-type floating gate 25.

In this embodiment of the present disclosure, when the IGBT device is in a forward blocking state, the n-type collector region 20 and the p-type collector region 30 are applied with a high voltage, the p-n junction diode formed by the n-type floating gate 25 and the p-type body region 22 in the MOSFET cell 200 is forward biased, and the n-type floating gate 25 in the MOSFET cell 200 is charged with a positive charge. This reduces a threshold voltage Vht1 of the current channel under the n-type floating gate 25 in the MOSFET cell 200. The voltage of the n-type floating gate 25 in the MOSFET cell 200 is related to the position of the opening 28 in the gate dielectric layer 24. Optionally, the opening 28 in the gate dielectric layer 24 is located below the n-type floating gate 25 and located on a side close to the n-type drift region 21, so that the n-type floating gate 25 can be charged with the positive charge more easily.

In this embodiment of the present disclosure, when the IGBT device is in a forward blocking state and a forward turn-on state, the collector-emitter voltage Vce is greater than 0 V, the threshold voltage Vht1 of the current channel under the n-type floating gate 25 in the MOSFET cell 200 has little influence on the threshold voltage Vth of the entire MOSFET cell 200, and the MOSFET cell 200 still has a high threshold voltage Vth. In this embodiment of the present disclosure, if the IGBT device is turned off, when the emitter-collector voltage Vec is greater than 0 V, the threshold voltage Vht1 of the current channel under the n-type floating gate 25 in the MOSFET cell 200 has a great influence on the threshold voltage Vth of the entire MOSFET cell 200, so the MOSFET cell 200 has a low threshold voltage Vth, and thereby, the current channel of the MOSFET cell 200 is turned on at a low gate voltage (or a voltage of 0 V). This can increase the reverse current flowing through the MOSFET cell 200, reduce the current flowing through a body diode parasitic in the IGBT device, and improve the reverse recovery speed of the entire IGBT device.

According to the IGBT device provided by the embodiment of the present disclosure, the reverse recovery speed of the IGBT device can be conveniently and accurately adjusted by controlling the number of MOSFET cells formed with p-n junction diodes in the MOSFET cell array, so that the IGBT device has wider application. Meanwhile, when the number of MOSFET cells formed with the p-n junction diodes is adjusted, it is only necessary to modify one mask for forming the opening in the gate dielectric layer, which can effectively control the manufacturing cost of the IGBT device.

In the MOSFET cell array of the IGBT device of the embodiment of the present disclosure, the gate electrode 26 of at least one MOSFET cell can be electrically connected to the n-type emitter region 23, that is, this part of the gate electrodes 26 are connected to the emitter voltage, which can reduce the gate charge of the IGBT device.

FIG. 2 is a sectional view of an IGBT device according to a second embodiment of the present application. Different from the structure of the IGBT device of the embodiment of the present disclosure shown in FIG. 1, in the IGBT device of this embodiment, the gate electrode 26 of the MOSFET cell extends toward a side of the n-type drift region 21 to be located above the n-type floating gate 25 and covers a sidewall of the n-type floating gate 25 close to the n-type drift region 21. This can increase the area of the n-type floating gate 25 covered by the gate electrode 26, and further can increase the capacitive coupling rate of the gate electrode 26 to the n-type floating gate 25.

What is claimed is:

1. An insulated gate bipolar transistor (IGBT) device, comprising:
   an n-type collector region, a p-type collector region, an n-type drift region located above the n-type collector region and the p-type collector region, and an metal-oxide-semiconductor field effect transistor (MOSFET) cell array composed of a plurality of MOSFET cells;
   wherein each of the plurality of MOSFET cells comprises: a p-type body region located at a top of the n-type drift region, an n-type emitter region located in the p-type body region, and a gate structure located above the p-type body region, wherein the gate structure comprises a gate dielectric layer, a gate electrode and an n-type floating gate, the gate electrode and the n-type floating gate are located above the gate dielectric layer, the gate electrode is located on a side close to the n-type emitter region, the n-type floating gate is located on a side close to the n-type drift region, and the gate electrode acts on the n-type floating gate through capacitive coupling; and
   wherein in the MOSFET cell array, the n-type floating gate of at least one of the plurality of MOSFET cells is isolated from the p-type body region through the gate dielectric layer, and the n-type floating gate of at least one of the plurality of MOSFET cells contacts the p-type body region through an opening to form a p-n junction diode, wherein the opening is located in the gate dielectric layer below the n-type floating gate.

2. The IGBT device of claim 1, further comprising: an n-type field cut-off region located above the n-type collector region and the p-type collector region, wherein the n-type field cut-off region is located below the n-type drift region.

3. The IGBT device of claim 1, wherein the gate electrode extends above the n-type floating gate.

4. The IGBT device of claim 1, wherein the gate electrode extends above the n-type floating gate and covers a sidewall of the n-type floating gate close to the n-type drift region.

5. The IGBT device of claim 1, wherein the opening is located below the n-type floating gate and on a side close to the n-type drift region.

6. The IGBT device of claim 1, wherein a gate electrode of at least one of the plurality of MOSFET cells is electrically connected to the n-type emitter region.

* * * * *